United States Patent [19]
Englund, Jr.

[11] Patent Number: 4,503,402
[45] Date of Patent: Mar. 5, 1985

[54] VOLTAGE CONTROLLED OSCILLATOR HAVING APPROXIMATELY CONSTANT MODULATION SENSITIVITY

[75] Inventor: Arvid E. Englund, Jr., Lynchburg, Va.

[73] Assignee: General Electric Company, Lynchburg, Va.

[21] Appl. No.: 409,522

[22] Filed: Aug. 19, 1982

[51] Int. Cl.³ .................. H03C 3/09; H03C 3/06; H03C 3/20; H03B 5/12
[52] U.S. Cl. .................. 331/36 C; 331/117 R; 331/117 FE; 331/177 V; 332/19; 332/30 V
[58] Field of Search .......... 331/36 C, 117 R, 117 FE, 331/177 V; 332/19, 30 V

[56] References Cited
U.S. PATENT DOCUMENTS

| | | | |
|---|---|---|---|
| 3,544,919 | 12/1970 | Stratman | 331/36 C X |
| 4,074,209 | 2/1978 | Lysobey | 331/177 V X |
| 4,378,534 | 3/1983 | Goedken et al. | 332/30 V X |

FOREIGN PATENT DOCUMENTS 1265238  4/1968  Fed. Rep. of Germany ... 332/30 V

OTHER PUBLICATIONS

Irvin, D. R. "F.M. Angle Modulator with Frequency Compensated Deviation" IBM Technical Disclosure Bulletin, vol. 21, No. 6, (Nov. 78), pp. 2482-2483.

Primary Examiner—Eugene R. LaRoche
Assistant Examiner—W. R. Paxman
Attorney, Agent, or Firm—James J. Williams; Robert C. Lampe, Jr.

[57] ABSTRACT

A voltage controlled oscillator for use in a phase locked loop is provided with a first varactor circuit that responds to a control signal to set the center frequency of the oscillator, and with a second varactor circuit comprising a modulation varactor that responds to a modulation signal to cause the oscillator to produce a modulated output. The modulation sensitivity of the oscillator is made relatively constant between upper and lower center frequencies by applying a portion of the modulation signal to the first varactor circuit in addition to the control signal.

11 Claims, 3 Drawing Figures

VOLTAGE CONTROLLED OSCILLATOR HAVING APPROXIMATELY CONSTANT MODULATION SENSITIVITY

BACKGROUND OF THE INVENTION

My invention relates to a voltage controlled oscillator for a phase locked loop, and particularly to such a voltage controlled oscillator that has improved modulation sensitivity over the output radio frequency range of the voltage controlled oscillator.

In a phase locked loop, particularly in a frequency synthesizer, a control signal from the loop phase detector is applied to the loop voltage controlled oscillator to determine or set the output center frequency or the output radio frequency of the voltage controlled oscillator. This control signal is applied to a control varactor (or voltage variable capacitor diode) coupled to an inductor in a resonant circuit. This control signal changes the varactor capacity, and hence changes the output center frequency of the voltage controlled oscillator. At the same time, a modulation signal (such as a voice or data signal) is applied to a modulation varactor (or sometimes to the control varactor) to change the varactor capacity and hence vary the frequency of the voltage controlled oscillator about its output center frequency. Where the output center frequency of the loop voltage controlled oscillator must be switched over a relatively wide range (such as a number of radio frequency channels), the change in capacity of the control varactor is or must be similarly wide. To provide this change, the control varactor capacity must be switched between a low value at the high frequency end of the range and a high value at the low frequency end of the range. But the capacity change of the modulation varactor with modulation is relatively small over the entire range. If the ratio of the capacity change produced by the modulation varactor to the total capacity of the control varactor at the high frequency end of the range is 0.1 for example, the corresponding ratio at the low frequency end of the range might be only 0.01. Thus, the modulation sensitivity of the voltage controlled oscillator varies. Under these conditions, if the modulation sensitivity is set at a desired level at the high frequency end of the range, insufficient modulation will likely result at the low frequency end of the range, and information may be lost. Or, if the modulation sensitivity is set to a desired value at the low frequency end of the range, excessive or illegel frequency deviations may result at the high frequency end of the range.

SUMMARY OF THE INVENTION

Briefly, my invention provides a circuit that couples some of the modulation signal to the control varactor that is used to set or determine the output center frequency of the voltage controlled oscillator, in addition to applying the modulation signal to the modulation varactor. I have found that because of the nonlinear response of a varactor, this additional coupling of the modulation signal to the control varactor results in a modulation sensitivity that is substantially constant over a fairly wide range of output frequencies. Hence, some of the problems of insufficient modulation at the low frequency end of the range or excessive frequency deviations at the high frequency end of the range are eliminated.

BRIEF DESCRIPTION OF THE DRAWING

The subject matter which I regard as my invention in particularly pointed out and distinctly claimed in the claims. The structure and operation of my invention, as well as advantages, may be better understood from the following description given in connection with the accompanying drawing, in which:

DESCRIPTION OF THE PREFERRED EMBODIMENT

Figure 1:
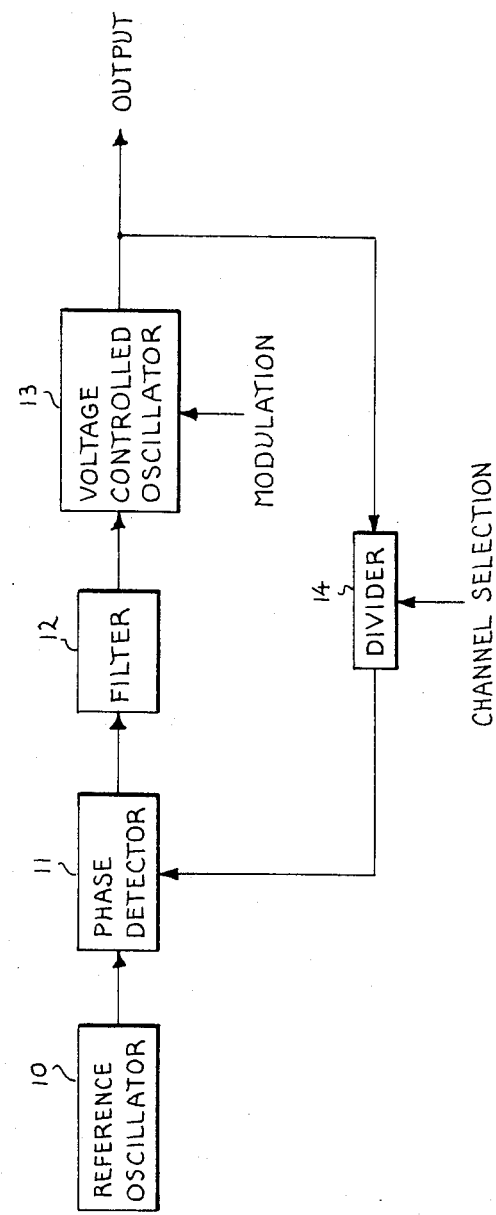
FIG. 1 shows a block diagram of a phase locked loop in which my voltage controlled oscillator can be used.

While I primarily intend that my voltage controlled oscillator be used in a phase locked loop, such as shown in FIG. 1, persons skilled in the art will appreciate or realize that my oscillator can also be used in other circuits. The phase locked loop of FIG. 1 is typical in the art, and includes a relatively stable reference oscillator 10 whose output is applied to one input of a phase detector 11. The output of the phase detector 11 is preferably filtered in a filter 12, whose output is applied to a control input of a voltage controlled oscillator 13. As mentioned earlier, the control input for the oscillator 13 is intended to set the center or nominal output frequency of the oscillator 13. Such an output frequency is typically in the tens of megahertz range. In addition, it is frequently desirable that modulation be applied to the oscillator 13, such modulation being an audible voice signal or other information. The output of the oscillator 13 is utilized in any desired way, such as being applied to a radio transmitter or other device. The output is also applied to a frequency divider 14 which divides the output frequency by a suitable amount, depending upon the exact output frequency desired. As an example, such an output frequency could be used to provide radio frequency carrier signals for a number of channels, the exact frequency being selected by a channel selection signal applied to the divider 14. The output of the divider 14 is applied to the other input of the phase detector 11 to complete the phase locked loop. Such a phase locked loop as described is known in the art.

As is typical in such oscillators, the resonant circuit inductor is usually fixed, and the resonant circuit capacitor is usually variable. For this reason, varactors (sometimes called a voltage variable capacity diode) are used in known voltage controlled oscillators. However, where the desired range of output frequencies is considerable, the varactor which responds to modulation signals has a greater effect at the higher frequencies, because the capacity needed to cause the oscillator to resonate at those higher frequencies is relatively small; and has a lesser effect at the lower frequencies, because the capacity needed to cause the oscillator to resonate at those lower frequencies is relatively large. As mentioned earlier, this effect may cause excessive frequency deviations when the oscillator is switched from a low frequency to a high frequency, or may provide insufficient modulation when the oscillator is switched from a high frequency to a low frequency.

Figure 2:
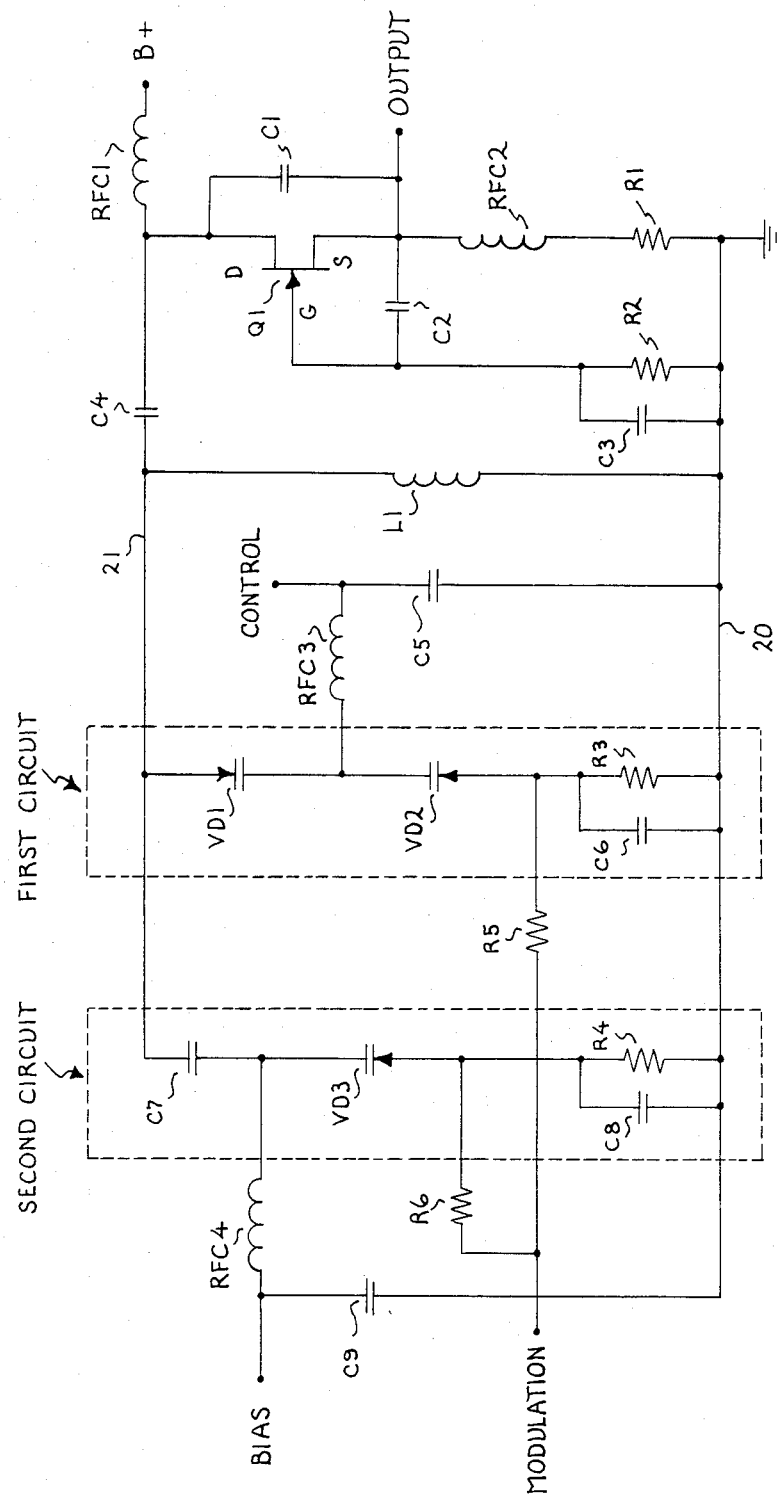
FIG. 2 shows a schematic diagram of a preferred embodiment of a voltage controlled oscillator in accordance with my invention.

FIG. 2 shows a voltage controlled oscillator in accordance with my invention that provides improved modulation sensitivity, and elminates some of the prior art problems. The oscillator of FIG. 2 includes an amplifying or active device such as a FET transistor Q1. The transistor Q1 is supplied with a suitable source of direct current voltage B+ through a choke RFC1 to its drain electrode. The source electrode is coupled through a choke RFC2 and a resistor R1 to a reference or ground bus 20. Feedback for the oscillator is provided by a capacitor C1 connected between the drain and source electrodes, and a capacitor C2 connected between the source and gate electrodes. A resistor R2 and capacitor C3 are connected between the gate electrode of the transistor Q1 and the ground bus 20. An output from the transistor Q1 may be derived at its source electrode. The drain electrode of the transistor Q1 is coupled by an isolating capacitor C4 to a resonant circuit, which I prefer to be a parallel resonant circuit. This parallel resonant circuit includes a fixed inductor L1, a first capacitive circuit, and a second capacitive circuit connected between an upper bus 21 and the ground bus 20. The first and second capacitive circuits are indicated by respective dashed line rectangles.

The first circuit comprises two varactor diodes VD1, VD2 connected in series in opposite conductive directions with the anode of the diode VD1 connected to the bus 21, and with the cathode of the diode VD2 connected to the cathode of the diode VD1. The varactor diodes, as known in the art, provide a capacity whose magnitude depends upon the reverse voltage applied across the diode. Hence, such a diode is shown by a diode symbol and a capacitor symbol. The anode of the diode VD2 is coupled through a capacitor C6 and a resistor R3 to the ground bus 20. A control signal, typically derived from the filter 12 of FIG. 1, is applied through a choke RFC3 to the cathodes of the diodes VD1, VD2. Bypass is provided by a bypass capacitor C5. The magnitude of the control signal applied to the diodes VD1, VD2 in reverse fashion determines their capacity. Since this capacity is coupled across the inductor L1, it determines in part the resonant frequency of the parallel circuit including the inductor L1 and the first circuit. As the reverse control voltage is increased, the capacity of the diodes VD1, VD2 is decreased to raise the resonant frequency. Conversely, as the reverse control voltage is decreased, the capacity is increased to lower the resonant frequency.

The second circuit in parallel with the inductor L1 comprises a fixed capacitor C7 connected to the bus 21, the cathode of a varactor diode VD3 connected to the capacitor C7, and a resistor R4 and capacitor C8 connected between the anode of the diode VD3 and the ground bus 20. Suitable bias is supplied to the varactor diode VD3 from a direct current voltage through a choke RFC4 which is bypassed by a capacitor C9. Modulation signals are applied to the second circuit through a resistor R6 to the anode of the varactor diode VD3. These modulation signals vary in accordance with the modulation input, to change or vary the reverse voltage across the varactor VD3, and hence change the capacity of the second circuit presented across the inductor L1. The oscillator responds to these changes and produces a frequency modulated output centered about a center frequency determined by the control signal applied to the first circuit.

When the control voltage applied to the first circuit is relatively small, it causes the varactors VD1, VD2 to present a relatively high capacity that causes the oscillator to produce an output at a low frequency. Hence, as far as my circuit as described thus far is concerned, the modulation signals have little effect on this capacity, and may result in insufficient modulation. However, as the control voltage is increased, the capacity of the diodes VD1, VD2 is decreased, and the modulation signals may cause excessive frequency deviations about the oscillator center frequency. Thus, the sensitivity of such an arrangement is not constant over the range of center frequencies of the oscillator.

In order to improve this sensitivity, I provide a portion of the modulation signal to the first circuit through a resistor R5 to the anode of the varactor diode VD2. The magnitude of the modulation signal so applied is determined by the magnitudes of the resistors R5, R3. These magnitudes can be easily adjusted so that the modulation sensitivity of the first and second circuits to a modulation signal is substantially constant over the range of center frequencies of the oscillator. To provide such an adjustment, I prefer that the resistor R5 be made adjustable and the resistor R3 be fixed. Then with a constant amplitude modulation signal (of 1000 Hertz for example) applied to the modulation input terminal, the control signal is set at its upper value for the high center frequency. The resistor R5 is adjusted to provide the desired frequency deviation. Then, the control signal is set at its lower value for the low center frequency, and the resistor R5 readjusted to provide the desired frequency deviation. After several adjustments with the control signal being set at its upper and lower values, a value for the resistor R5 can be found that causes the output to produce a modulation frequency swing or deviation that is substantially the same for these upper and lower center frequencies. And, I have found that the modulation frequency deviation is also relatively constant for intermediate center frequencies after the adjustment is completed.

Figure 3:
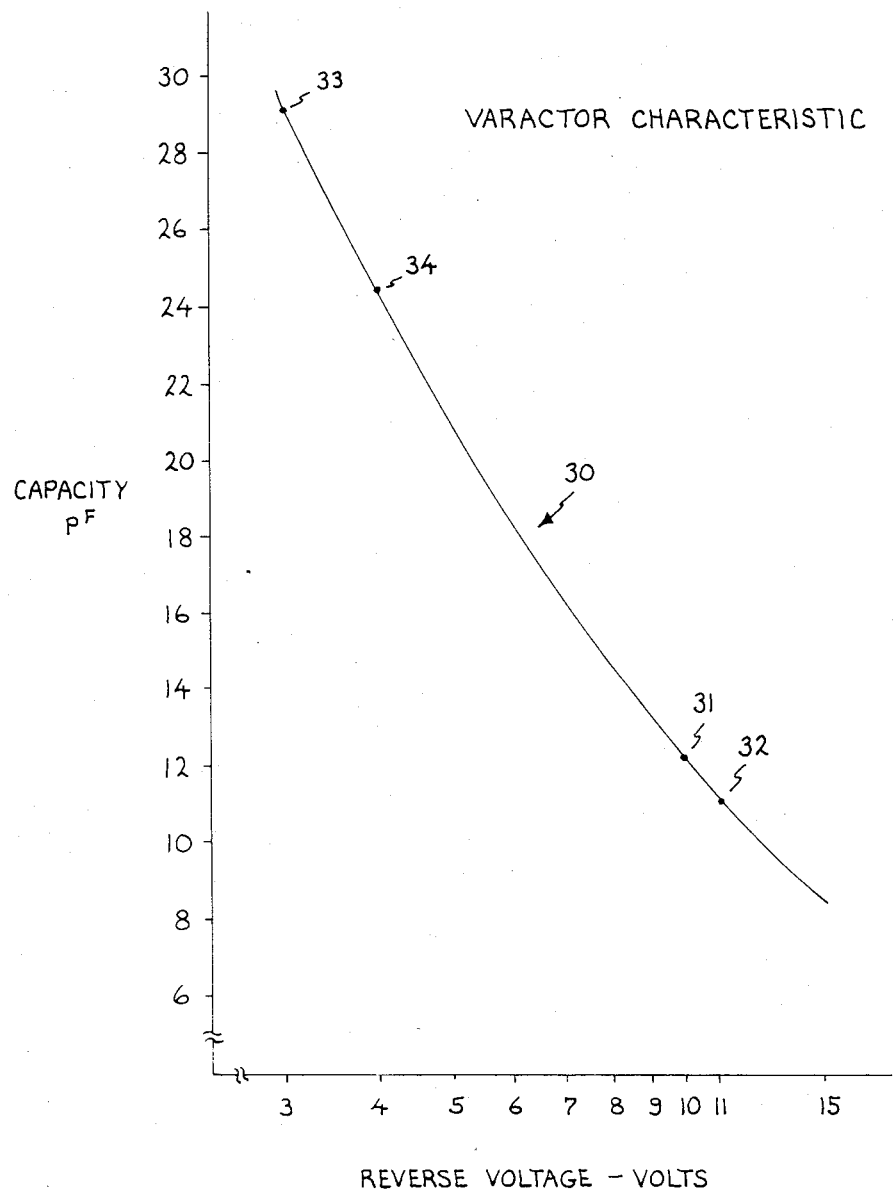
FIG. 3 shows the capacity versus reverse voltage characteristic of a typical varactor for explaining the operation of my invention.

While a mathematical explanation for this substantially constant modulation sensitivity can be provided, such an explanation is relatively complex. And, it is not necessary to an understanding of my invention. However, reference to FIG. 3 will show that for a varactor diode having the characteristic 30 shown, the change in capacity for a modulation swing of ±0.5 volt at a control voltage of 10.5 volts is only approximately one picofarad, as indicated by the points 31, 32. The change in capacity for a modulation swing of ±0.5 volt at a control voltage of 3.5 volts is approximately 5 picofarads, as indicated by the points 33, 34. This exponential or nonlinear characteristic enables the modulation sensitivity of the oscillator to be made relatively constant by applying some of the modulation signal to the first circuit for the center frequency control.

While I have shown only one embodiment in accordance with my invention, persons skilled in the art will appreciate the modifications that may be made. For example, in the first circuit, the varactor VD1 may be replaced by a fixed capacitor if the range of the other varactor VD2 is sufficient. Varactors may be provided in parallel to provide additional capacity. Other types of resonant circuits can be used. And, of course, different oscillator circuits can be used with my invention. Therefore, while my invention has been described with reference to a particular embodiment, it is to be understood that modifications may be made without departing from the spirit of the invention or from the scope of the claims.

What I claim as new and desire to secure by Letters Patent of the United States is:

1. An improved voltage controlled oscillator comprising:
   a. an oscillator circuit comprising an active device coupled to a resonant circuit for producing an output having a frequency determined by said resonant circuit;
   b. said resonant circuit comprising;
      1. an inductor;
      2. a first varactor circuit coupled in parallel with said inductor for providing a capacity determined by a control voltage applied to said first varactor circuit;
      3. a second varactor circuit coupled in parallel with said first varactor circuit and said inductor for providing a capacity determined by a modulation signal applied to said second varactor circuit;
   c. and circuit means coupling a selected portion of said modulation signal to said first varactor circuit for causing said first varactor circuit capacity to be additionally determined by said modulation signal.

2. The improved voltage controlled oscillator of claim 1 wherein said circuit means comprise a resistor circuit coupled to said first and second varactor circuits.

3. The improved voltage controlled oscillator of claim 1 or claim 2 wherein said first varactor circuit includes two serially connected varactors.

4. An improved voltage controlled oscillator for use in a phase locked loop comprising:
   a. an oscillator comprising a transistor having a feedback circuit, and an inductor coupled to said transistor to provide an output signal having a frequency determined in part by the magnitude of said inductor;
   b. a first varactor circuit coupled in parallel with said inductor to provide a resonant circuit for said oscillator and which is responsive to a control signal derived within the phase locked loop to determine the center frequency of said output signal;
   c. a second varactor circuit coupled in parallel with said first varactor circuit and said inductor to provide a portion of said resonant circuit;
   d. and a modulation circuit coupled to said first and second varactor circuits for applying a modulation signal thereto that causes the frequency of said output signal to vary about said center frequency in accordance with said modulation signal.

5. The improved voltage controlled oscillator of claim 4 wherein said modulation circuit is coupled by resistors to said first and second varactor circuits to provide modulation signals thereto in a selected ratio.

6. The improved voltage controlled oscillator of claim 5 wherein said first varactor circuit includes two varactors serially connected in opposite conductive directions, and said control circuit is connected across said two varactors.

7. The improved voltage controlled oscillator of claim 4 wherein said first varactor circuit includes two varactors serially connected in opposite conductive directions, and said control circuit is connected across said two varactors.

8. An improved voltage controlled oscillator for use in a phase locked loop comprising:
   a. an oscillator comprising a signal amplifying device and a feedback circuit having an inductive reactance coupled to said signal amplifying device to provide an output signal whose center frequency is determined in part by the magnitude of said inductive reactance;
   b. a first series circuit comprising at least one varactor, a capacitor, and a resistor coupled across said inductive reactance;
   c. means for applying a control signal, derived from said phase locked loop, to said varactor of said first series circuit to cause said first series circuit to provide a selected capacitive reactance which, with said inductive reactance, determines at least in part said center frequency;
   d. a second series circuit comprising a varactor and a resistor coupled across said inductive reactance;
   e. input means for applying a modulation signal, derived from an information input, to said varactor of said second series circuit to cause said second series circuit to provide a capacitive reactance which, with said inductive reactance, causes said output signal to vary about said center frequency in accordance with said modulation signal;
   f. and a resistor circuit connected from said input means to said first series circuit to provide a portion of said modulation signal to said varactor of said first series circuit.

9. The improved voltage controlled oscillator of claim 8 and further comprising a bias circuit coupled to said second series circuit.

10. The improved voltage controlled oscillator of claim 8 or claim 9 wherein said capacitor of said first series circuit comprises a varactor.

11. The improved voltage controlled oscillator of claim 8 or claim 9 wherein said input means comprise a resistor circuit.

* * * * *